United States Patent [19]

Shenoy et al.

[11] Patent Number: 5,994,766
[45] Date of Patent: Nov. 30, 1999

[54] FLIP CHIP CIRCUIT ARRANGEMENT WITH REDISTRIBUTION LAYER THAT MINIMIZES CROSSTALK

[75] Inventors: Jayarama N. Shenoy, Santa Clara; Paul Findley, Cupertino, both of Calif.

[73] Assignee: VLSI Technology, Inc., San Jose, Calif.

[21] Appl. No.: 09/157,631

[22] Filed: Sep. 21, 1998

[51] Int. Cl.⁶ .................................................. H01L 23/552
[52] U.S. Cl. ........................... 257/659; 257/691; 257/664
[58] Field of Search ..................................... 257/659, 691, 257/664

[56] References Cited

U.S. PATENT DOCUMENTS

| | | | |
|---|---|---|---|
| 4,811,082 | 3/1989 | Jacabs et al. | 257/659 |
| 4,866,507 | 9/1989 | Jacabs et al. | 257/659 |
| 4,984,200 | 1/1991 | Saitoo et al. | 257/659 |
| 5,294,751 | 3/1994 | Kamada | 257/659 |
| 5,300,899 | 4/1994 | Suski | 333/1 |
| 5,345,105 | 9/1994 | Sun et al. | 257/659 |

*Primary Examiner*—Sheila V. Clark
*Attorney, Agent, or Firm*—Wood, Herron & Evans, L.L.P.

[57] ABSTRACT

A circuit arrangement for a flip chip utilizes fixed potential shield traces between various signal traces in a redistribution layer to decrease coupling impedances and crosstalk within the layer. In particular, by orienting a fixed potential shield trace between a pair of signal traces and/or between a pair of differential trace pairs, capacitive coupling between the traces is greatly reduced, thereby permitting the signal traces to be routed closer to one another than would be possible if the shield trace was omitted. Often, minimum line width and spacing design rules may be met to ensure maximum circuit density for the redistribution layer and the associated device interconnections, and without concern for excessive adverse effects due to capacitive coupling between traces in the redistribution layer.

18 Claims, 4 Drawing Sheets

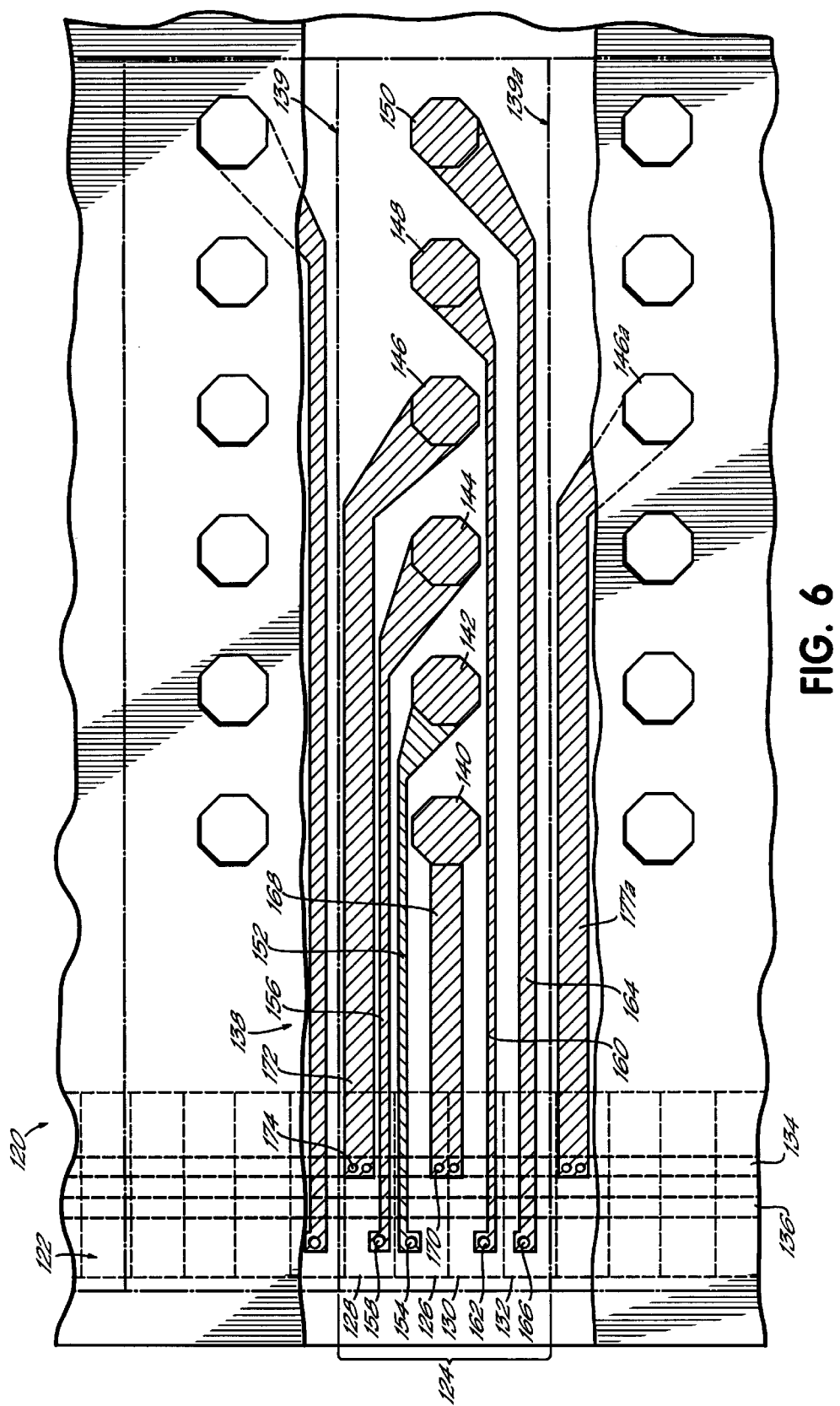

FLIP CHIP CIRCUIT ARRANGEMENT WITH REDISTRIBUTION LAYER THAT MINIMIZES CROSSTALK

FIELD OF THE INVENTION

The invention is generally related to integrated circuit device design and layout, and more particularly, to the layout of integrated circuit device interconnects to minimize crosstalk.

BACKGROUND OF THE INVENTION

As integrated circuit devices become faster and more complex, the interconnections between such devices with one another and with other components on a circuit board can limit the performance achievable in an integrated circuit system. Whereas integrated circuit devices, also referred to as "chips", once were mounted into individual packages having arrays of metal pins that interconnected with the metal traces on a circuit board, and with bond wires connecting the chips to the package pins, more advanced designs often must rely on integrated circuit devices that are directly mounted onto the surface of the metal traces of an advanced package or circuit board to ensure adequate interconnect performance.

One example of such an integrated circuit device is known as a "flip chip", which includes a number of solder bumps disposed on one side of the chip that are used to interconnect with corresponding pads on a package, a circuit board, or a multi-chip module (MCM), etc. The flip chip is so named because the flip chip is placed on the package, board, or MCM face down with the solder bumps resting on the corresponding pads on the package, board or MCM. Then, through any number of available surface mount technology (SMT) processes, each of which usually includes the application of heat and/or pressure to the back side of the flip chip, the solder bumps are physically and electrically connected to the pads to securely mount the flip chip. The elimination of bond wires in a flip chip package, or of the entire packaging for a flip chip when directly mounted to a board or MCM, reduces the amount of space on the circuit board occupied by the flip chip, thus permitting more components to be placed on a given size of circuit board. More importantly, however, the total lengths of the interconnections between active device components can be minimized to reduce signal propagation delays and signal distortion and increase the permissible operating speed of the components on the circuit board.

Signals are often routed in an integrated circuit device and on a circuit board using signal traces, which are essentially conductive "wires" manufactured on a device or board. One significant limitation on system performance is known as crosstalk, which occurs when two signals traces are routed proximate one another and a signal present on one trace interferes with and generates noise on the other trace due to electromagnetic coupling (including capacitive coupling) between the traces. Moreover, electromagnetic coupling also results in the presence of a coupling impedance between adjacent traces to skew the signals present on the traces and introduce delays in the signals. Due to both effects, the speed in which a circuit can operate error-free is limited, and thus, the effects directly impact the overall speed and performance of a system.

Also, the adverse effects of both crosstalk and coupling impedance increase as the distance between signal traces decreases. However, as systems become more complex and powerful and require greater functionality, signal traces often must be placed as close together as possible to conserve as much space as possible. Crosstalk and coupling impedance thus become more and more problematic for more advanced designs.

One specific area in which it is particularly desirable to minimize crosstalk and coupling impedance is in the redistribution layer of an integrated circuit device such as a flip chip. A redistribution layer often is used to interconnect the operational circuitry of a device with an array of pads that are used to interconnect a device with a package, MCM or circuit board (e.g., using solder bumps disposed on the pads). The layout of pads in the redistribution layer directly impacts the die size, and consequently, the overall cost of the device. Furthermore, as circuits become more complex, a greater number of interconnects are usually required, so it is desirable to reduce the distance between the pads to increase the circuit density of the pads and thereby permit a larger number of pads to fit within a given area.

Design of an integrated circuit device typically follows a series of design rules, which specify a number of parameters that must be complied with to ensure reliable manufacture and operation. Among other parameters, often minimum trace widths and spacings are defined, which are dependent upon the particular manufacturing process used. However, with conventional redistribution layer designs, the capacitive coupling between adjacent traces often necessitate that traces be spaced and configured with dimensions that are well above the minimums specified by the design rules. As a result, significant space that could otherwise be utilized by a particular manufacturing process is often wasted due to impedance and crosstalk concerns, and circuit density is consequently diminished.

Therefore, a significant need exists for a manner of increasing the density of an integrated circuit device redistribution layer while minimizing coupling impedances and crosstalk within the layer.

SUMMARY OF THE INVENTION

The invention addresses these and other problems associated with the prior art by providing a circuit arrangement for a flip chip that utilizes fixed potential shield traces between various signal traces in a redistribution layer to decrease coupling impedances and crosstalk within the layer. In particular, by orienting a fixed potential shield trace between a pair of signal traces and/or between a pair of differential trace pairs, capacitive coupling between the signal traces is greatly reduced, thereby permitting the signal traces to be routed closer to one another than would be possible if the shield trace was omitted. Often, minimum line width and spacing design rules may be utilized to ensure maximum circuit density for the redistribution layer and the associated device interconnections, and without concern for excessive adverse effects due to capacitive coupling between traces in the redistribution layer.

Therefore, consistent with one aspect of the invention, a circuit arrangement for a flip chip is provided, including a logic circuit with a plurality of input/output (I/O) ports and disposed in at least one logic circuit layer; and a redistribution layer circuit arrangement disposed in a redistribution layer. The redistribution circuit arrangement includes a plurality of pads arranged in a predetermined pattern; a plurality of signal redistribution traces, with each signal redistribution trace electrically connecting an I/O port to a pad; and a plurality of shield traces. Each non-differential pair of adjacent signal redistribution traces from the plurality of signal redistribution traces has interposed therebetween an associated shield trace from the plurality of shield traces, with each shield trace connected to a fixed potential and operatively configured to reduce capacitive coupling between the pair of adjacent signal redistribution traces associated therewith.

Consistent with another aspect of the invention, a circuit arrangement for a flip chip is provided, including a logic circuit with a plurality of input/output (I/O) ports arranged generally along at least one peripheral edge thereof and disposed in at least one logic circuit layer; and a redistribution circuit arrangement disposed in a redistribution layer, with the redistribution circuit arrangement including a plurality of tiles arranged generally along the at least one peripheral edge of the logic circuit. Each tile includes a plurality of pads arranged in a linear array extending generally perpendicular to the peripheral edge of the logic circuit, with the plurality of pads including first and second signal pads and a fixed potential pad; a plurality of signal redistribution traces, with the plurality of signal redistribution traces including first and second signal redistribution traces, and with the first signal redistribution trace electrically connecting one of the plurality of I/O ports to the first signal pad, and the second signal redistribution trace electrically connecting another of the plurality of I/O ports to the second signal pad; and first and second shield traces, each electrically connected between a fixed potential and the fixed potential pad, with the first shield trace interposed between the first and second signal redistribution traces, and the second shield trace interposed between one of the first and second signal redistribution traces and an adjacent tile in the redistribution layer such that each of the first and second signal redistribution traces in the plurality of tiles is bounded on both sides by a shield trace to reduce capacitive coupling with adjacent signal redistribution traces thereto.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

BRIEF DESCRIPTION OF THE DRAWINGS

FIG. 6 is a diagram of an alternate layout for one of the redistribution layer tiles for the flip chip of FIG. 3, for use in redistributing differential signals.

DETAILED DESCRIPTION

Figure 1:
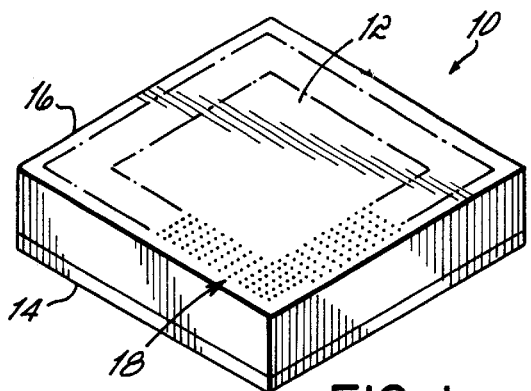
FIG. 1 is a perspective view of a flip chip consistent with the invention.

The embodiments of the invention described hereinafter utilize redistribution layer circuit arrangements with fixed potential shield traces between pairs of non-differential signal traces to reduce capacitive coupling between the signal traces and thereby minimize crosstalk and coupling impedance therebetween. For differential pairs of signal traces which cooperatively carry a differential signal, shield traces are not utilized between the signal traces in a differential pair, since it is not problematic, and it can often be beneficial, for coupling to exist between the signal traces in a differential pair. Rather, shield traces are utilized to shield such differential pairs of signal traces from other signal traces or other differential pairs to minimize capacitive coupling in the circumstances for which it is desirable to do so.

In the context of the invention, a redistribution circuit arrangement is an arrangement of conductive traces used to interface a logic circuit on a flip chip with a number of external connections for the device to facilitate external communications with the device. A redistribution circuit arrangement is typically disposed in a separate layer (referred to herein as a redistribution layer) from the primary logic circuitry in a flip chip (which is typically disposed in one or more logic circuit layers). It should further be recognized that integrated circuit devices such as flip chips and the like are typically designed and fabricated using one or more computer data files, referred to herein as hardware definition programs, that define the layout of the circuit arrangements on the devices. The programs are typically generated by a design tool and are subsequently used during manufacturing to create the layout masks that define the circuit arrangements applied to a semiconductor wafer. Typically, the programs are provided in a predefined format using a hardware definition language (HDL) such as VHDL, verilog, EDIF, etc. Thus, while the invention has and hereinafter will be described in the context of circuit arrangements implemented in fully functioning integrated circuit devices, those skilled in the art will appreciate that circuit arrangements consistent with the invention are capable of being distributed as program products in a variety of forms, and that the invention applies equally regardless of the particular type of signal bearing media used to actually carry out the distribution. Examples of signal bearing media include but are not limited to recordable type media such as volatile and non-volatile memory devices, floppy disks, hard disk drives, CD-ROM's, and DVD's, among others, and transmission type media such as digital and analog communications links.

Typically, the redistribution circuit arrangement includes a plurality of pads through which external (e.g., package, board or MCM) connections to the integrated circuit device are made. Then, based upon the type of integrated circuit device, different connector components may be formed on the pads to facilitate the physical and electrical interconnection of the device with a package, an MCM, or a circuit board such as a flexible or rigid printed circuit board or the like. For example, one type of integrated circuit device suitable for use herewith is a "flip chip", which utilizes solder bumps formed on the pads of the redistribution circuit arrangement to form the physical and electrical interconnections for the flip chip. However, it should be appreciated that the principles of the invention may also apply to other types of integrated circuit devices in the alternative.

A logic circuit may be considered to include any digital and/or analog circuitry used to perform the primary operations of a device. Typically, external input and output to and from a logic circuit is made through one or more input/output (I/O) ports, which may be considered to include any input/output buffers, pads, terminals, etc. defined in the logic circuit for the purpose of communicating a signal between the logic circuit and an external device. In the embodiments discussed herein, I/O ports are disposed within I/O "slots" containing various active devices and interconnecting circuitry necessary to provide an external interface for the circuit. The I/O slots are typically arranged in linear arrays of cells or tiles defined along the periphery of an integrated circuit device.

A redistribution layer consistent with the invention utilizes one or more signal redistribution traces to electrically connect an I/O port to a pad. The signal redistribution traces typically extend generally parallel to one another. One or more shield traces are then interposed between adjacent signal redistribution traces. Two signal redistribution traces are considered to be adjacent in the context of the invention even though a shield trace is interposed therebetween, so long as no other signal redistribution traces are interposed between the two traces.

To minimize capacitive coupling, the shield traces are non-switching, i.e., they are held at a fixed potential, typically by connecting the traces to ground and/or power, also conventionally referred to respectively as $V_{SS}$ and $V_{DD}$. Moreover, at least a portion of the shield traces may also serve a second function of connecting a fixed potential pad to a corresponding external fixed potential source to provide the power and ground sources for the integrated circuit device.

Turning now to the Drawings, wherein like numbers denote like parts throughout the several views, FIG. 1 illustrates a flip chip 10 consistent with the invention. Flip chip 10 includes an active side 12 and back side 14, with a periphery 16 defined along the edge of the flip chip.

An array 18 of solder bumps is disposed on active side 12 of flip chip 10 for the purpose of forming the physical and electrical interconnections between the flip chip and a substrate such as a package, MCM, or flexible or rigid printed circuit board, among others. Various arrangements of solder bumps may be utilized in array 18, e.g., a "window frame" array extending around periphery 16 of flip chip 10, or an array that is disposed over the entire active side 12 of flip chip 10, among others. It should be appreciated that active side 12 generally faces the underlying substrate in operation, and thus, is typically not visible once the flip chip is mounted to a substrate.

Figure 2:
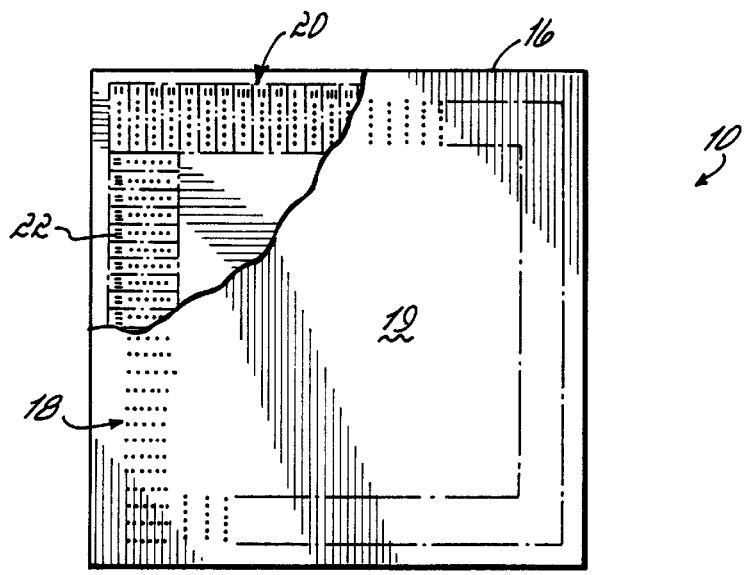
FIG. 2 is a top plan view of the active side of the flip chip of FIG. 1, with portions cut away to illustrate the layout of tiles in the redistribution layer thereof.

FIG. 2 illustrates a top plan view of flip chip 10 with the top protective layer on active side 12 of flip chip 10 cut away to expose some of the underlying components in the chip. An active region 19 diagrammatically represents the logic circuitry formed on the flip chip. It should be appreciated that logic circuit 19 can extend nearly to the periphery 16 of the chip, if desired.

Overlaid over logic circuit 19 is a redistribution circuit arrangement 20 formed in a redistribution layer that overlays the layers forming the logic circuit. To facilitate the design of circuit arrangement 20, an array of cells or tiles 22 is arranged along the periphery 16 of flip chip 10 to form circuit arrangement 20. As will become more apparent below, a wide variety of tile arrangements may be utilized to maximize the density of interconnection paths on the chip.

Figure 3:
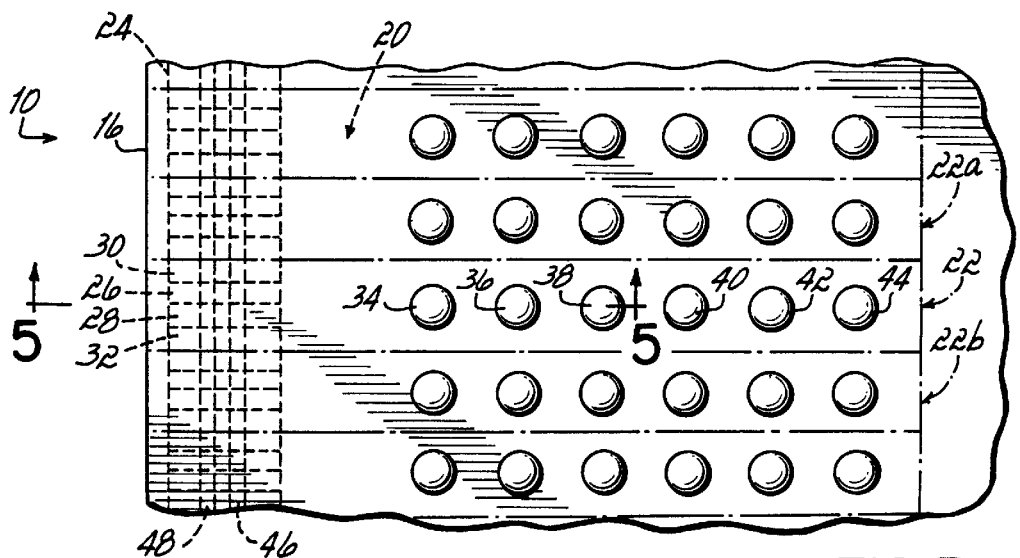
FIG. 3 is an enlarged fragmentary top plan view of the active side of the flip chip of FIG. 2, illustrating the arrangement of several tiles in the redistribution layer.

As shown in FIG. 3, each tile, such as tile 22, tile 22a and tile 22b, is used to electrically interconnect one or more of a plurality of I/O slots 24 arranged about the periphery 16 of flip chip 10, with one or more of a plurality of solder bumps in array 18. In addition, each tile may also interconnect one or more solder bumps in array 18 with the power and/or ground distribution layers in the logic circuit.

For tile 22, for example, four I/O slots 26, 28, 30 and 32, a power bus 46, and a ground bus 48 are electrically interconnected with a plurality of solder bumps 34, 36, 38, 40, 42 and 44. This maintains a 4:1:1 signal:power:ground ratio, which has been found to be desirable for many applications.

In the illustrated embodiment, the solder bumps associated with each tile are arranged in a linear array extending generally perpendicular to periphery 16. Power and ground buses 46, 48 run generally along periphery 16, as does the array 24 of I/O slots.

The mapping of solder bumps to I/O slots and the power and ground bus within each tile may vary in different applications. One beneficial arrangement, for example, maps solder bump 34 to power bus 46 and solder bump 40 to ground bus 48, leaving solder bumps 36, 38, 42 and 44 for mapping respectively to I/O slots 26, 28, 30 and 32. However, it should be appreciated that other arrangements may be utilized in the alternative. Moreover, each tile may use the same mapping, or different mappings can be used in other tiles.

Figure 4:
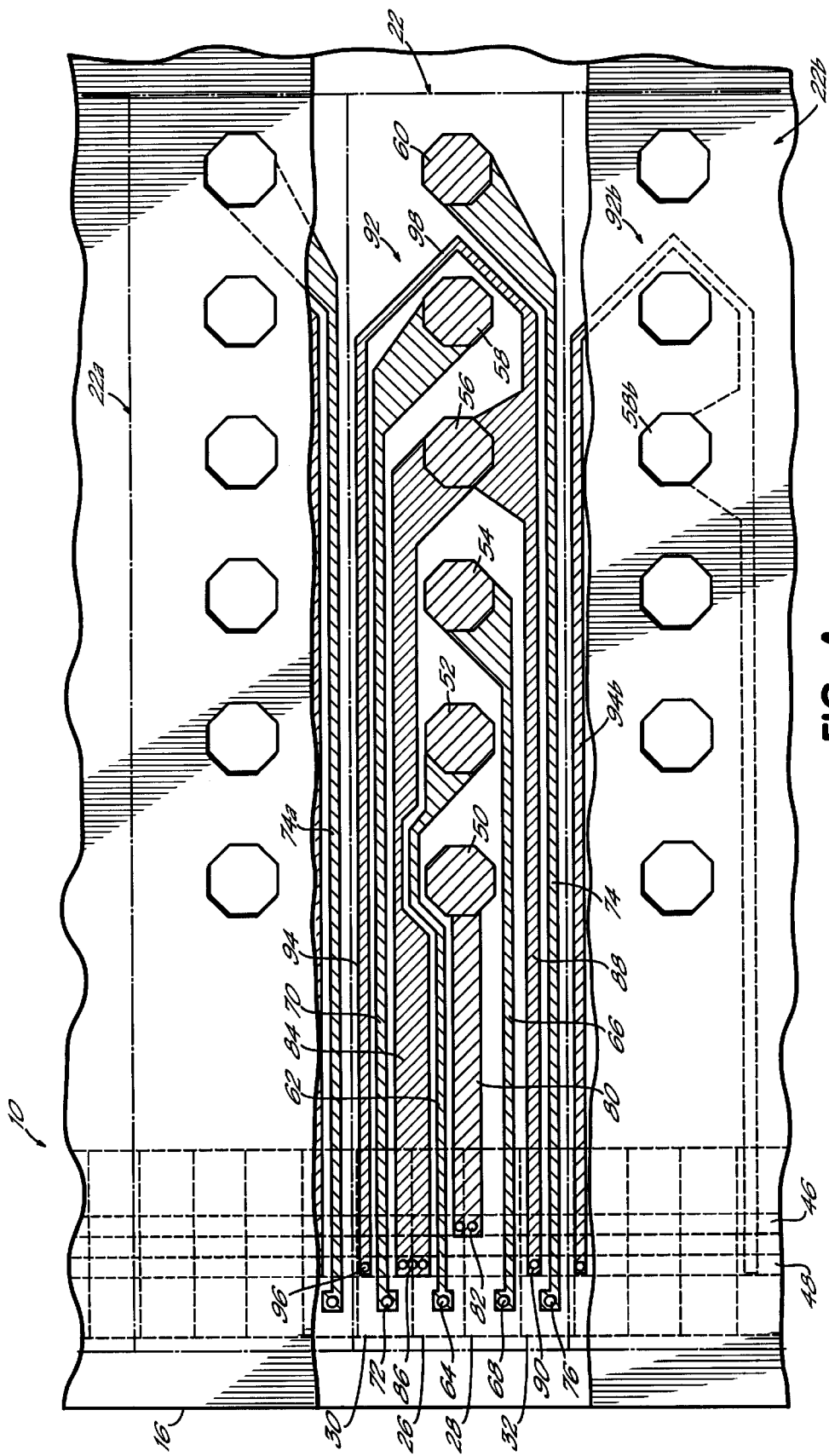
FIG. 4 is a diagram of the layout for one of the redistribution layer tiles for the flip chip of FIG. 3, for use in redistributing non-differential signals.

Turning now to FIG. 4, one suitable layout of the redistribution circuit arrangement for tile 22 is illustrated, with portions of the redistribution circuit arrangements in tiles 22a and 22b also shown to illustrate the shielding provided between adjacent tiles in the redistribution layer. Tile 22 includes a plurality of pads 50, 52, 54, 56, 58 and 60, corresponding to bumps 34, 36, 38, 40, 42 and 44 (FIG. 3). Pad 52 is a signal pad electrically connected to I/O slot 26 via a signal redistribution trace 62. The interconnection between trace 62 and I/O slot 26 is made through a via 64. Similarly, pad 54 is a signal pad that is electrically connected to I/O slot 28 by means of a signal redistribution trace 66 and a via 68. Furthermore, pads 58 and 60 are also signal pads respectively electrically connected to I/O slots 30, 32 through signal redistribution traces 70, 74 and vias 72, 76.

To reduce the capacitive coupling between signal redistribution traces 62 and 66, a shield (or power) trace 80 is interposed therebetween, which also serves the secondary purpose of electrically connecting pad 50 with power bus 46. Pad 50 is thus a fixed potential (or more specifically, a power) pad. It may be desirable to maximize the width of trace 80 as illustrated in FIG. 4, as well as to use multiple vias 82 to interconnect the trace with the power bus, to reduce the resistance and increase the current-carrying capacity of the trace.

To reduce the capacitive coupling between traces 62 and 70, a shield (or ground) trace 84 is interposed therebetween, which also serves to electrically connect pad 56 to ground bus 48. As such, pad 56 is a fixed potential (or more specifically, a ground) pad. Also, similar to trace 80, it may be desirable to maximize the width of trace 84 and to utilize multiple vias (e.g., three vias 86) to connect the trace to the ground bus, to minimize the resistance and maximize the current-carrying capacity of the trace.

A third shield trace 88 is utilized to reduce the capacitive coupling between trace 66 and trace 74. Shield trace 88 is interposed between these signal redistribution traces, and electrically connects pad 56 to ground bus 48 on an opposing side of the linear array of pads 50–60 from ground trace 84. Trace 88 is terminated in a via 90 that connects the trace to ground bus 48.

In addition to shielding the signal redistribution traces within tile 22, given the tiled nature of the redistribution layer, it is also desirable to provide adequate shielding to reduce the capacitive coupling between adjacent tiles in the redistribution layer. One suitable manner of doing so is to utilize a fourth shield trace 92 having a first portion 94 that extends along signal redistribution trace 70 and that electrically connects with ground bus 48 through a via 96. A second portion 98 extends between pads 58 and 60 to electrically connect with pad 56, as well as shield trace 88, on the opposite side of the linear array from first portion 94. As such, it may be seen that pad 58 and trace 70 are completely circumscribed by shield traces connected to the same fixed potential. This results in trace 70 being shielded on one side from trace 62 in the same tile via shield trace 84, and shielded on the other side from a signal redistribution trace on an adjacent tile (e.g., signal redistribution trace 74a of tile 22a) by portion 94 of shield trace 92. Similarly, as illustrated by tile 22b, which is adjacent tile 22 on the opposite side of tile 22a, this repeating arrangement of shield traces also adequately shields signal redistribution trace 74 of tile 22 from an adjacent redistribution trace (not shown) via a portion 94b of a shield trace 92b that extends around pad 58b connected to trace 70b.

It should be appreciated that, with the configuration of shield and signal redistribution traces shown in FIG. 4, each signal redistribution trace is substantially shielded on both sides by a shield trace connected to a fixed potential. It should be appreciated that a wide number of alternate layouts may be utilized to maintain this relationship, including alternate arrangements of pads, alternate arrangements of signal traces and/or alternate arrangements of shield traces. For example, different signal redistribution traces and/or shield traces may be routed along either side of the linear array of pads to modify the relative arrangement of traces within the tile. Other modifications will be apparent to one of ordinary skill in the art.

Figure 5:
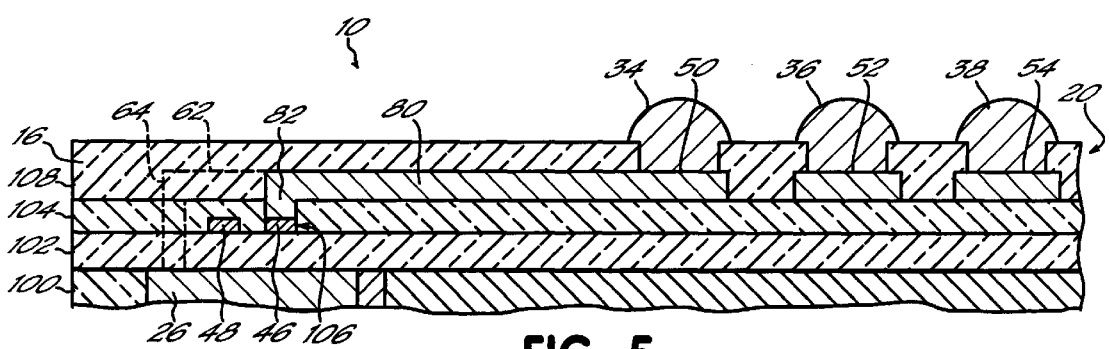
FIG. 5 is a cross-sectional view of the flip chip of FIG. 3, taken through line 5—5 thereof.

FIG. 5 illustrates a cross-sectional view of the various layers in flip chip 10. For example, I/O slot 26 is illustrated as being within a logic circuit layer 100 within which is defined the logic circuitry for flip chip 10. It should be appreciated that typically multiple layers of metal, insulator and semiconductor materials are typically deposited on a semiconductor substrate to form the various gates and other circuitry for the I/O slots and the logic circuit. However, given that a multitude of I/O slot and logic circuit designs may be used consistent with the invention, as well as the fact that the manner of depositing and forming circuitry on a semiconductor substrate is well known in the art, no further discussion of the logic circuit or the I/O slots need be provided herein.

Layered over the logic circuit layer 100 is an insulator layer 102, followed by a power distribution plane 104 within which a conductive layer 106 is defined for routing the power and ground buses 46, 48, in a manner well known in the art. It should be appreciated that the power and ground buses may also be disposed in separate planes in the alternative.

The redistribution circuit arrangement 20 is disposed in a redistribution layer 108 that overlays the power distribution layer 104. As shown in FIG. 5, shield trace 80 interconnects fixed potential pad 50 with power bus 46 through via 82. Also, as illustrated in phantom, signal trace 62 is shown electrically interconnected with pad 52 and I/O slot 26, with the latter connection made through a via represented at 64.

Upon each of the pads in redistribution layer 108 is deposited a corresponding solder bump, in any known manner, (e.g., solder bumps 34, 36 and 38 deposited on pads 50, 52 and 54). It should be appreciated that the manner of forming a redistribution layer on top of an active logic circuit, as well as the manner of depositing solder bumps on a flip chip, are well known in the art, and thus need not be discussed in further detail herein. As an example, a five or six metal layer process may be utilized whereby redistribution layer 108 forms the metal 5 or 6 layer, with the ground and power buses in layer 106 being defined at the metal 4 or metal 5 layers, and the remaining metal layers being utilized for logic circuit 19.

While a wide variety of design rules may be utilized consistent with the invention, it is believed that a redistribution layer consistent with the invention may be used to provide solder bump pitch of 200 $\mu$m, using 85 $\mu$m wide pads, a minimum trace spacing of about 2.5 $\mu$m, and a minimum trace width of about 5 $\mu$m. It is also believed that sufficient DC resistance characteristics for the redistribution layer may be maintained with a redistribution layer thickness of about 2 $\mu$m. Of course, other process parameters and/or design rules may be used in the alternative.

An alternate tile design suitable for use with differential signal pairs is illustrated in FIG. 6. Here, a flip chip 120 is illustrated as having an array 122 of I/O slots, with a group 124 associated with a redistribution circuit arrangement 138 in a tile 139. Group 124 includes a first pair of I/O slots 126, 128 over which is supplied a differential signal. A second differential signal is communicated with a pair of I/O slots 130, 132. Moreover, a ground bus 134 and power bus 136 are provided running along the length of the array 122 of I/O slots. A redistribution circuit arrangement 138 is illustrated for tile 139, as is a partial representation of a circuit arrangement in an adjacent tile 139a. Tile 139 includes a linear array of pads 140, 142, 144, 146, 148 and 150. Pads 142 and 144 are configured to carry the first differential signal via a pair of signal redistribution traces 152, 156, which are respectively electrically connected to I/O slots 126, 128 by vias 154, 158. In this instance, traces 152, 156 run along the same side of the linear array immediately adjacent one another. Since traces 152, 156 cooperatively carry a differential signal, capacitive coupling therebetween is generally not a concern, and may in some instances be beneficial.

Pads 148, 150 are electrically connected to I/O slots 130, 132 via signal redistribution traces 160, 164, which are connected to I/O slots 130, 132 through vias 162, 166. Similar to traces 152, 156, traces 160, 164 run immediately adjacent one another along the same side of the linear array such that some degree of capacitive coupling exists between the traces.

To shield traces 152, 156 from traces 160, 164, a shield trace 168 is interposed therebetween, electrically connecting pad 140 to power bus 136 through via 170.

To shield the other side of traces 152, 156 from adjacent signal redistribution traces in adjacent tiles, a shield trace 172 is used, electrically connecting pad 146 with ground bus 134 through vias 174. This has the effect of shielding traces 152, 156 from traces similar to traces 160, 164 on adjacent tiles in the redistribution layer. For example, in tile 139a, a conductive trace 177a is illustrated as extending along side traces 160, 164 and electrically connecting pad 146a to ground bus 134.

It should be appreciated that alternate arrangements of signal redistribution and/or shield traces may be utilized to ensure that each differential pair of signal redistribution traces is shielded on both sides to reduce capacitive coupling with adjacent signal redistribution traces. Moreover, it should be appreciated that differential and non-differential signal redistribution traces may be supported within the same redistribution layer, e.g., via separate tiles, or in the alternative, within the same tile. Implementation of such variations would be apparent to one of ordinary skill in the art based upon a reading of the material herein.

Figure 7:
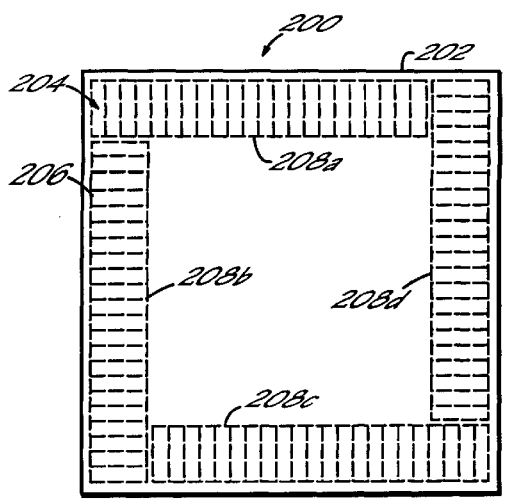
FIGS. 7, 8 and 9 are top plan views of several flip chips consistent with the invention, illustrating alternate tile layouts in the redistribution layer thereof.
Figure 8:
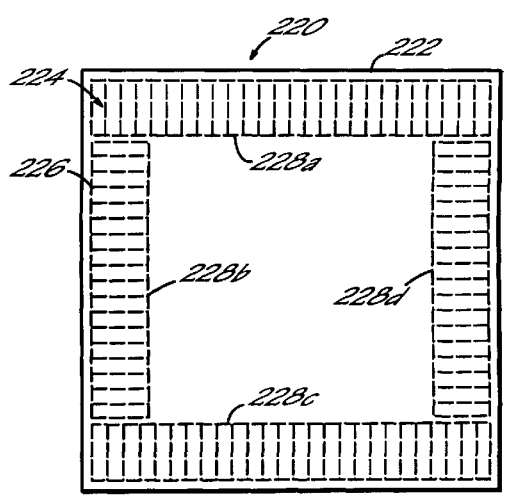
Figure 9:
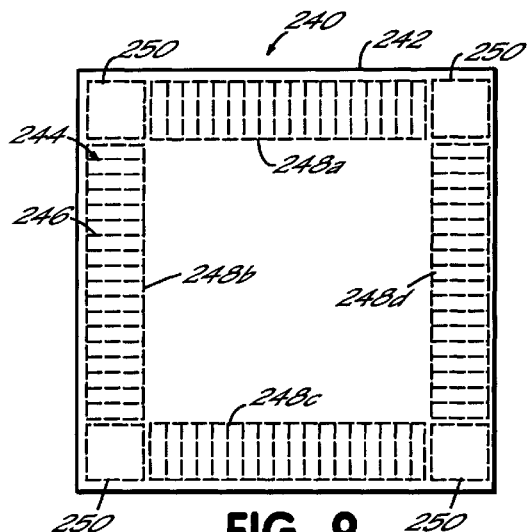

FIGS. 7–9 illustrate several manners in which the tiles illustrated in FIGS. 4 and 6 may be arranged to maximize the density of solder bumps and I/O slots on an integrated circuit device. FIG. 7, for example, illustrates a flip chip 200 having a periphery 202 about which is disposed a redistribution layer 204 having a plurality of tiles 206. Layer 204 is broken into four linear arrays 208a, 208b, 208c and 208d. Each array 208a–d is of the same length, and each array extends from one corner of the periphery 202 to abut at its opposing end with another array. FIG. 8 illustrates an alternate arrangement where a flip chip 220 with a periphery 222 includes a redistribution layer 224 having a plurality of tiles 226 arranged into four linear arrays 228a, 228b, 228c and 228d. Arrays 228a and 228c extend parallel to one another along opposing edges of the flip chip, with each extending along the full length thereof. The remaining space along the two perpendicular edges thereto is occupied by arrays 228b and 228d.

In each of the above arrangements, it is possible that a non-optimal routing may result, resulting in either package design rule violations and/or requiring a small number of signals in the corners to not be used. To address this concern, FIG. 9 illustrates yet another arrangement whereby a flip chip 240 with a periphery 242 includes a redistribution layer 244 having a plurality of tiles 246 arranged in four equal length linear arrays 248a, 248b, 248c and 248d. However, rather than having each array extend along the entire length on the edge of the chip, a series of corner tiles 250 are utilized in each corner of the chip.

Figure 10:
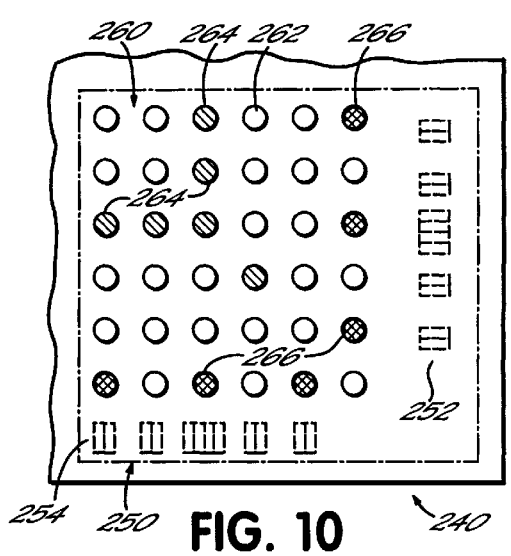
FIG. 10 is a top plan view of a corner tile from the flip chip of FIG. 9.

While a wide variety of routing arrangements may be utilized in a corner tile, one suitable routing arrangement is illustrated in FIG. 10, where a corner tile 250 is configured to connect I/O slots from linear arrays 252, 254 to various pads formed in a six-by-six array 260. Signal pads are illustrated at 262 by unfilled circles. Ground pads are illustrated at 264 by circles filled with diagonal lines. Cross-hatched circles are used to illustrate power pads 226. Given that the density of I/O slots in the corner tiles is significantly lower, a wide variety of possible layouts may be utilized to route traces between the pads, buses and I/O slots.

Software simulations have verified the reduction in capacitive coupling through use of shield traces in the manner disclosed herein. In particular, for a redistribution layer disposed in a metal 4 layer over a metal 3 ground plane, with two signal traces separated by a 5 $\mu$m shield trace with a minimum spacing requirement of 2.5 $\mu$m, the peak noise as a percentage of $V_{DD}$ is about 1.3%, compared to a value of 9.1% when the two signal traces are immediately adjacent one another and separated by the minimum spacing of 2.5 $\mu$m. Even if the unshielded signal traces are separated by a 10 $\mu$m spacing (the same effective spacing between adjacent signal traces when a shield trace is interposed therebetween), the peak noise is still about 3.6% of $V_{DD}$. Consequently, even with the same density of signal traces, crosstalk is reduced by nearly 64%.

With the redistribution layer disposed in a metal 6 layer above a metal 5 ground plane, the crosstalk in the redistribution layer falls to 0.8% of $V_{DD}$ when a shield trace is interposed between adjacent signal traces. This compares to a value of 4.9% when two adjacent signal traces are unshielded and separated by 2.5 $\mu$m spacing, and 1.7% of $V_{DD}$ when the shield traces are spaced by 10 $\mu$m spacing. Consequently, for this example, crosstalk is still improved by nearly 53% with no reduction in signal trace density.

Various modifications may be made to the embodiments disclosed herein without departing from the spirit and scope of the invention. For example, it may be desirable to adjust the skew between the shortest and longest signal traces in the redistribution layer, as disclosed, for example, in U.S. patent application Ser. No. 08/976,564, filed on Nov. 24, 1997 by Shenoy et al., and assigned to the same assignee as the present invention. As discussed in this application, skew can be adjusted in signal traces of different lengths by altering the width of the traces to adjust the relative capacitances of shorter or longer traces. The disclosure of the aforementioned application is hereby incorporated by reference herein.

Other modifications will be apparent to one of ordinary skill in the art. Therefore, the invention lies in the claims hereinafter appended.

What is claimed is:

1. A circuit arrangement for a flip chip, comprising:
   (a) a logic circuit including a plurality of input/output (I/O) ports and disposed in at least one logic circuit layer; and
   (b) a redistribution circuit arrangement disposed in a redistribution layer, the redistribution circuit arrangement including:
      (1) a plurality of pads arranged in a predetermined pattern;
      (2) a plurality of signal redistribution traces, each signal redistribution trace electrically connecting an I/O port to a pad; and
      (3) a plurality of shield traces, wherein each non-differential pair of adjacent signal redistribution traces from the plurality of signal redistribution traces has interposed therebetween an associated shield trace from the plurality of shield traces, with each shield trace connected to a fixed potential and operatively configured to reduce capacitive coupling between the pair of adjacent signal redistribution traces associated therewith.

2. The circuit arrangement of claim 1, wherein the logic circuit further comprises a plurality of Input/Output (I/O) slots, each of which connected to at least one of the plurality of I/O ports.

3. The circuit arrangement of claim 1, wherein at least a portion of the plurality of shield traces are connected to ground.

4. The circuit arrangement of claim 1, wherein at least a portion of the plurality of shield traces are connected to power.

5. The circuit arrangement of claim 1, wherein the plurality of I/O ports includes first and second differential I/O ports configured to collectively transmit a differential signal, wherein the plurality of signal traces includes first and second differential signal traces respectively connected to the first and second I/O ports, and wherein the first and second differential signal traces are immediately adjacent one another with no shield trace interposed therebetween.

6. The circuit arrangement of claim 1, wherein at least a portion of the plurality of pads are connected to a fixed potential through a shield trace from the plurality of shield traces.

7. The circuit arrangement of claim 6, wherein:

(a) the plurality of I/O ports includes first, second, third and fourth I/O ports;
(b) the plurality of pads includes first, second, third and fourth signal pads, a power pad and a ground pad;
(c) the plurality of signal traces includes first, second, third and fourth signal traces respectively connecting the first, second, third and fourth I/O ports with the first, second, third and fourth signal pads; and
(d) the plurality of shield traces includes a power trace and a ground trace respectively connected to the power pad and the ground pad.

8. The circuit arrangement of claim 7, wherein the plurality of pads are oriented in a linear array, wherein the linear array extends from an outer end to an inner end, with the outer end disposed proximate a periphery of the circuit arrangement, and wherein the power pad, the first signal pad, the second signal pad, the ground pad, the third signal pad, and the fourth signal pad are arranged in order in the linear array from the outer end to the inner end thereof.

9. The circuit arrangement of claim 8, further comprising a ground bus and a power bus extending perpendicular to the linear array of pads, and wherein:
(a) the first, second, third and fourth I/O ports are generally arranged in a direction along the ground and power buses;
(b) the power trace electrically connects the power pad to the power bus;
(c) the first and second signal traces extend along opposite sides of the linear array of pads such that the power trace is interposed therebetween;
(d) the third and fourth signal traces extend along opposite sides of the linear array of pads; and
(e) the ground trace is one of first and second ground traces that electrically connect the ground pad to the ground bus, with the first and second ground traces extending along opposite sides of the linear array of pads, with the first ground trace interposed between the two of the first, second, third and fourth signal traces that are disposed on the same side of the linear array of pads as the first ground trace, and with the second ground trace interposed between the other two of the first, second, third and fourth signal traces that are disposed on the same side of the linear array of pads as the second ground trace.

10. The circuit arrangement of claim 9, wherein the plurality of shield traces further includes a third ground trace having first and second portions, the first portion electrically connected to the ground bus and extending along one side of the linear array of pads immediately adjacent the one of the third and fourth signal traces disposed on the same side of the linear array of pads, and the second portion electrically connected to the ground pad on the other side of the linear array of pads and extending between the third and fourth pads.

11. The circuit arrangement of claim 1, wherein the plurality of pads includes first and second signal pads disposed adjacent one another and respectively connected to first and second I/O ports from the plurality of I/O ports via first and second signal traces from the plurality of signal traces, and wherein the plurality of shield traces includes at least one shield trace that includes a first portion extending between the first and second signal traces and a second portion extending between the first and second signal pads.

12. The circuit arrangement of claim 11, wherein the plurality of pads further includes a fixed potential pad, wherein the plurality of pads are defined in a linear array, wherein the first portion of the at least one shield trace extends along one side of the linear array, and wherein the second portion of the at least one shield trace is operatively connected to the fixed potential pad proximate the other side of the linear array.

13. A flip chip comprising the circuit arrangement of claim 1.

14. A circuit arrangement for a flip chip, comprising:
(a) a logic circuit including a plurality of input/output (I/O) ports arranged generally along at least one peripheral edge thereof and disposed in at least one logic circuit layer; and
(b) a redistribution circuit arrangement disposed in a redistribution layer, the redistribution circuit arrangement including a plurality of tiles arranged generally along the at least one peripheral edge of the logic circuit, each tile including:
(1) a plurality of pads arranged in a linear array extending generally perpendicular to the peripheral edge of the logic circuit, the plurality of pads including first and second signal pads and a fixed potential pad;
(2) a plurality of signal redistribution traces, the plurality of signal redistribution traces including first and second signal redistribution traces, the first signal redistribution trace electrically connecting one of the plurality of I/O ports to the first signal pad, and the second signal redistribution trace electrically connecting another of the plurality of I/O ports to the second signal pad; and
(3) first and second shield traces, each electrically connected between a fixed potential and the fixed potential pad, the first shield trace interposed between the first and second signal redistribution traces, and the second shield trace interposed between one of the first and second signal redistribution traces and an adjacent tile in the redistribution layer such that each of the first and second signal redistribution traces in the plurality of tiles is bounded on both sides by a shield trace to reduce capacitive coupling with adjacent signal redistribution traces thereto.

15. The circuit arrangement of claim 14, wherein the fixed potential pad is interposed between the first and second signal pads in the linear array.

16. The circuit arrangement of claim 14, wherein the first signal pad is interposed between the fixed potential pad and the second signal pad, and wherein one of the first and second signal redistribution traces includes first and second portions extending on opposite sides of the linear array and electrically connected via an intermediate portion that extends between the first and second signal pads.

17. A circuit arrangement for a flip chip, comprising:
(a) a logic circuit including a plurality of input/output (I/O) ports arranged generally along at least one peripheral edge thereof and disposed in at least one logic circuit layer; and
(b) a redistribution circuit arrangement disposed in a redistribution layer, the redistribution circuit arrangement including a plurality of tiles arranged generally along the at least one peripheral edge of the logic circuit, each tile including:
(1) a plurality of pads arranged in a linear array extending generally perpendicular to the peripheral edge of the logic circuit, the plurality of pads including in order from the plurality of I/O ports a first fixed potential pad, first and second signal pads, a second fixed potential pad, and third and fourth fixed potential pads;

(2) a plurality of signal redistribution traces, the plurality of signal redistribution traces including first, second, third and fourth signal redistribution traces respectively electrically connecting the first, second, third and fourth signal pads with selected I/O ports from the plurality of I/O ports, the first and third signal redistribution traces extending along a first side of the linear array and the second and fourth signal redistribution traces extending along a second side of the linear array; and (3) a plurality of shield traces, the plurality of shield traces including first, second, third and fourth shield traces, the first shield trace electrically connected between a first fixed potential and the first fixed potential pad and interposed between the first and second signal redistribution traces, and the second, third and fourth shield traces electrically connected between a second fixed potential and the second fixed potential pad, wherein the second shield trace is interposed between the first and third signal distribution traces, the third shield trace is interposed between the second and fourth signal distribution traces, and the fourth shield trace includes first and second portions extending on opposite sides of the linear array and electrically connected via an intermediate portion that extends between the third and fourth signal pads, the first portion extending along the first side of the linear array and interposed between the third signal redistribution trace and an adjacent tile in the plurality of tiles, such that each of the plurality of signal redistribution traces in the plurality of tiles is bounded on both sides by a shield trace to reduce capacitive coupling with adjacent signal redistribution traces thereto.

18. A circuit arrangement for a flip chip, comprising:

(a) a logic circuit including a plurality of differential input/output (I/O) port pairs arranged generally along at least one peripheral edge thereof and disposed in at least one logic circuit layer, each differential I/O port pair configured to collectively transmit a differential signal; and (b) a redistribution circuit arrangement disposed in a redistribution layer, the redistribution circuit arrangement including a plurality of tiles arranged generally along the at least one peripheral edge of the logic circuit, each tile including:

(1) a plurality of pads arranged in a linear array extending generally perpendicular to the peripheral edge of the logic circuit, the plurality of pads including in order from the plurality of differential I/O port pairs a first fixed potential pad, a first and second signal pads, a second fixed potential pad, and third and fourth fixed potential pads;

(2) a plurality of signal redistribution traces, the plurality of signal redistribution traces including first, second, third and fourth signal redistribution traces, the first and second signal redistribution defining a first differential trace pair electrically connecting a first differential I/O port pair with the first and second signal pads and extending along a first side of the linear array, and the third and fourth signal redistribution traces defining a second differential trace pair electrically connecting a second differential I/O port pair with the third and fourth signal pads and extending along a second side of the linear array; and (3) a plurality of shield traces, the plurality of shield traces including first and second shield traces, the first shield trace electrically connected between a first fixed potential and the first fixed potential pad and interposed between the first and second differential trace pairs, and the second shield trace electrically connected between a second fixed potential and the second fixed potential pad and extending along the first side of the linear array immediately adjacent first differential trace pair such that the second shield trace is interposed between the first differential trace pair and an adjacent tile in the plurality of tiles, such that each of the differential trace pairs in the plurality of tiles are bounded on both sides by shield traces to reduce capacitive coupling with adjacent differential trace pairs thereto.

* * * * *